United States Patent [19]

Yamada et al.

[11] Patent Number: 5,459,106
[45] Date of Patent: Oct. 17, 1995

[54] METHOD FOR MANUFACTURING A SEMICONDUCTOR LIGHT EMITTING DEVICE

[75] Inventors: Masato Yamada, Annaka; Tadashi Sakurai, Gunma, both of Japan

[73] Assignee: Shin-Etsu Handotai Co., Ltd., Tokyo, Japan

[21] Appl. No.: 310,088

[22] Filed: Sep. 22, 1994

[30] Foreign Application Priority Data

Sep. 24, 1993 [JP] Japan .................. 5-261903

[51] Int. Cl.$^6$ ............................... H01L 21/02
[52] U.S. Cl. .................. 437/237; 437/979; 437/906; 148/DIG. 163; 148/DIG. 99
[58] Field of Search ................... 437/236, 237, 437/127, 979, 905, 906; 148/DIG. 99, DIG. 43, DIG. 116, DIG. 163

[56] References Cited

U.S. PATENT DOCUMENTS

| 3,855,112 | 12/1974 | Tomozawa et al. | 437/236 |
| 3,914,465 | 10/1975 | Dyment et al. | 437/237 |
| 3,935,083 | 1/1976 | Tomozawa et al. | 437/236 |
| 5,262,360 | 11/1993 | Holonyak et al. | 437/237 |

FOREIGN PATENT DOCUMENTS

| 283953A | 9/1988 | European Pat. Off. | 437/236 |
| 4216683 | 6/1992 | Japan . | |
| 2120845 | 12/1983 | United Kingdom | 437/236 |

OTHER PUBLICATIONS

Chemical Abstracts vol. 118, No. 8, item 69652, Feb. 22, 1993.

Primary Examiner—Brian E. Hearn
Assistant Examiner—Leon Radomsky
Attorney, Agent, or Firm—Ronald R. Snider

[57] ABSTRACT

An AlGaAs chip which has an n-type layer and a p-type layer is immersed in an aqueous solution containing 0.2–0.6 wt. % of ammonia and 25–35 wt. % of hydrogen peroxide to form a primary protective layer, and after drying the AlGaAs chip, the AlGaAs chip is for a second time immersed in an aqueous solution containing 0.2–0.6 wt. % of ammonia and 25–35 wt. % of hydrogen peroxide to form a secondary protective layer.

3 Claims, 5 Drawing Sheets

METHOD FOR MANUFACTURING A SEMICONDUCTOR LIGHT EMITTING DEVICE

BACKGROUND OF THE INVENTION

1. Related Applications

This application claims the priority of Japanese Patent Application No. 5-261903 filed on Sep. 24, 1993, which is incorporated herein by reference.

2. Field of the Invention

This invention relates to a method of manufacturing a light emitting device, and more precisely to a method of manufacturing a light emitting device wherein deterioration of brightness is effectively prevented by forming a protective layer on the AlGaAs chip surface.

3. Prior Art

A light emitting device generally comprises an n-electrode and a p-electrode provided on a compound semiconductor chip which has a pn junction, and the chip is molded entirely with epoxy resin. FIG. 4 shows an example of the structure of a conventional light emitting device. In this light emitting device, an AlGaAs chip 10 which comprises an n-type layer 11 and a p-type layer 12 has an n-electrode 13 on the n-type layer side and a p-electrode 14 on the p-type layer side, and the chip 10 is fixed to a base 16 by silver paste and such. The chip 10 is sealed entirely with epoxy resin mold 15.

In general, epoxy resin is hygroscopic and is poor in an effect of moisture prevention. Therefore, under high humidity, moisture in the air penetrates into the epoxy resin mold 15 and reacts with AlGaAs, particularly when an electric current flows in the light emitting device during operation, changing in quality of the surface. As shown in FIG. 5, an opaque altered layer 17 is generated on the top surface and the side surfaces of the n-type layer 11. When this opaque altered layer 17 is generated, the light extraction efficiency decreases and hence the brightness of the light emitting device decreases.

Because of this, a method has been proposed in which a translucent protective layer 18 primarily composed of aluminum oxide is formed on the top surface and the side surfaces of the AlGaAs chip 10 (the 42nd Japan Society of Applied Physics and Related Societies, pp 600, 9a-D-3, 1981, and the 44th Japan Society of Applied Physics and Related Societies, pp 485, 28a-H-3, 1983).

This method utilizes the fact that an aqueous solution containing ammonia and hydrogen peroxide reacts with AlGaAs mixed crystals to form an aluminum oxide coating layer. That is, the AlGaAs chip 10 is immersed in said ammonia-hydrogen peroxide aqueous solution to form a protective layer 18 primarily composed of aluminum oxide on the light extracting surface (hereafter referred to as the "upper surface") and the side surfaces so that the AlGaAs chip 10 is protected from the penetrating moisture. The thickness of this protective layer 18 is preferably 100 nm or more.

Also, Japanese unexamined patent publication (Tokkai) Hei 4-216683 proposes a method in which an AlGaAs chip is immersed in an aqueous solution containing 0.3–0.6 wt. % of ammonia and 25–35 wt. % of hydrogen peroxide to form a protective layer on said chip surface.

In the methods in which the chip is immersed in an ammonia-hydrogen peroxide aqueous solution, such as described above, the upper surface (the surface on the side of the n-type layer 11 in FIG. 4) or the surface which is to be fixed to a base (the surface on the side of the p-type layer 12 in FIG. 4, hereafter referred to as the "lower surface") is adhered to an adhesive sheet, and the AlGaAs chip 10, together with the adhesive sheet, is immersed in said ammonia-hydrogen peroxide aqueous solution. It is particularly preferable to perform the immersion treatment with the chip's lower surface adhered to the adhesive sheet. This is because the protective layer 18 is not formed or has difficulty forming on the surface which is adhered to the adhesive sheet, and the chip's lower surface does not need the protective layer 18 since it will be fixed to the base 16.

With such methods as described above, however, it was not possible to form protective layers with a uniform thickness. There was a significant difference between the generation rates of the protective layers on the side of the n-type layer 11 and on the side of the p-type layer 12 of the AlGaAs chip 10. That is, as shown in FIG. 6, a thick protective layer 18 with a thickness of 100 nm or more was formed on the side of the n-type layer 11, whereas the protective layer 18 was thinner on the side of the p-type layer 12, and it was impossible to form a stable protective layer 18 with a thickness over 100 nm on this side. Because of this, under high humidity, the upper surface and the side surfaces of the AlGaAs chip 10 were changed in quality from the side of the p-type layer 12, leading to a decrease in brightness and hence a decrease in the reliability of the light emitting device.

Even when the duration time of the immersion of the chip 10 in the ammonia-hydrogen peroxide aqueous solution was increased so as to thicken the protective layer 18 on the side of the p-type layer 12, it was still difficult to thicken only the protective layer 18 on the side of the p-type layer 12 and the thickness difference compared with the side of the n-type layer 11 became even greater. An effort to increase the thickness of the protective layer 18 on the side of the p-type layer 12 resulted in a protective layer 18 too thick on the side of the n-type layer before the thickness of the protective layer 18 on the side of the p-type layer 12 reached 100 nm, causing cracks and thus being impossible to formate a good protective layer throughout the entire chip surface.

Further, according to the methods, the AlGaAs chip 10 is immersed in an ammonia-hydrogen peroxide aqueous solution, and particularly the chip 10 is immersed in an ammonia-hydrogen peroxide aqueous solution with the lower chip surface (the surface which is to be fixed to the base, i.e. the surface on the side of the p-type layer 12 in FIG. 4) adhered to an adhesive sheet. There was a problem in that since the exchangeability with the aqueous solution became poorer near the adhesive sheet, the generation rate of the protective layer 18 on the side of the p-type layer 12 became smaller relative to the rate on the side of the n-type layer 11, hence the protective layer 18 on the side of the p-type layer 12 became even thinner.

BRIEF SUMMARY OF THE INVENTION

The object of this invention is to provide a method of manufacturing a light emitting device which allows formation of a protective layer with a sufficient thickness, 100 nm or more, on the side of the p-type layer, without causing cracks in the coating layer on the side of the n-type layer of the AlGaAs chip, thus preventing a reduction in brightness, even under the condition of high humidity.

This invention provides a method of manufacturing a light emitting device characterized by the fact that an AlGaAs chip which has an n-type layer(s) and a p-type layer(s) is treated with the following processes to form a protective layer primarily composed of aluminum oxide on the top surface and the side surfaces of the AlGaAs chip:

(1) A process in which the AlGaAs chip which has the n-type layer(s) and the p-type layer(s) is immersed in an ammonia-hydrogen peroxide aqueous solution containing 0.2–0.6 wt. % of ammonia and 25–35 wt. % of hydrogen peroxide (the primary process).

(2) A process in which, after said process (1), the AlGaAs chip is dried (the drying process).

(3) A process in which, after said process (2), the AlGaAs chip is immersed again in an aqueous solution of ammonia-hydrogen peroxide solution containing 0.2–0.6 wt. % of ammonia and 25–35 wt. % of hydrogen peroxide (the secondary process).

It is preferable to first adhere the lower surface of the AlGaAs chip (the surface which is to be fixed to a base) to an adhesive sheet and perform said process (1) and then process (2) with this configuration, and then to change the surface of said AlGaAs chip which is adhered to the adhesive sheet from the lower surface to the upper surface (the surface on the light extracting side) of the chip, and finally to perform said process (3) with the upper surface of the AlGaAs chip adhered to the adhesive sheet.

The thickness of the formed protective layer composed primarily of aluminum oxide is preferably 100 nm or more.

This invention begins with a process in which the AlGaAs chip is immersed in an ammonia-hydrogen peroxide aqueous solution containing 0.2–0.6 wt. % of ammonia and 25–35 wt. % of hydrogen peroxide, so that an aluminum oxide coating layer is formed on the AlGaAs chip surface (the primary process). In this process, just as in conventional methods, a thick coating layer is formed on the side of the n-type layer and a thin coating layer is formed on the side of the p-type layer. The AlGaAs chip is then dried to harden the coating layer, thus forming a passivated, finer (higher density) and more stable layer (the drying process).

A process is then performed in which the AlGaAs chip is immersed again in an ammonia-hydrogen peroxide aqueous solution containing 0.2–0.6 wt. % of ammonia and 25–35 wt. % of hydrogen peroxide, thus forming a thick coating layer, 100 nm or thicker, on both the side of the n-type layer and the side of the p-type layer (the secondary process).

In this case, since there has already been formed a passivated and fine (high density) aluminum oxide coating layer, the layer generation rates decreases on both the side of the n-type layer and the side of the p-type layer. However, the layer generation rate on the side of the n-type layer, onto which a thicker layer has already been formed, is relatively small compared with the rate on the side of the p-type layer, hence the newly formed coating layer will be thinner and will not become thick enough to cause cracks. On the other hand, on the side of the p-type layer, onto which a thinner coating layer has been formed, a relatively thick coating layer will be newly formed, allowing the formation of a final protective layer with a thickness of 100 nm or more.

The processes in which the AlGaAs chip is immersed in the ammonia-hydrogen peroxide aqueous solution are actually performed by adhering the AlGaAs chip to an adhesive sheet and immersing the sheet with the chip on it in said aqueous solution. As mentioned above, the exchangeability with the aqueous solution is poor at areas closer to the adhesive sheet and hence the layer generation rate is relatively small, so that the formed layer is thin.

Formation of a layer with a more uniform thickness is possible by the following method: first immersing the AlGaAs chip in the ammonia-hydrogen peroxide aqueous solution with its lower surface (the surface which is to be fixed to the base) adhered to an adhesive sheet; taking out the AlGaAs chip from said aqueous solution and drying it; switching the surface of said AlGaAs chip which is adhered to the adhesive sheet from the lower surface to the upper surface (the surface on the light extracting side) (sheet transfer); and then immersing the AlGaAs chip in the ammonia-hydrogen peroxide aqueous solution with its upper surface adhered to the adhesive sheet.

When the upper chip surface of the AlGaAs chip is adhered to the adhesive sheet in the primary process and the chip's lower surface is adhered to the adhesive sheet in the second process for layer generation, the upper surface of the AlGaAs chip is contaminated by the adhesive and good layer formation on said chip upper surface may not be possible in the second process.

DETAILED DESCRIPTION

Examples of this invention are described in detail below by referring to FIGS. 1 through 3.

Example 1

Figure 1:
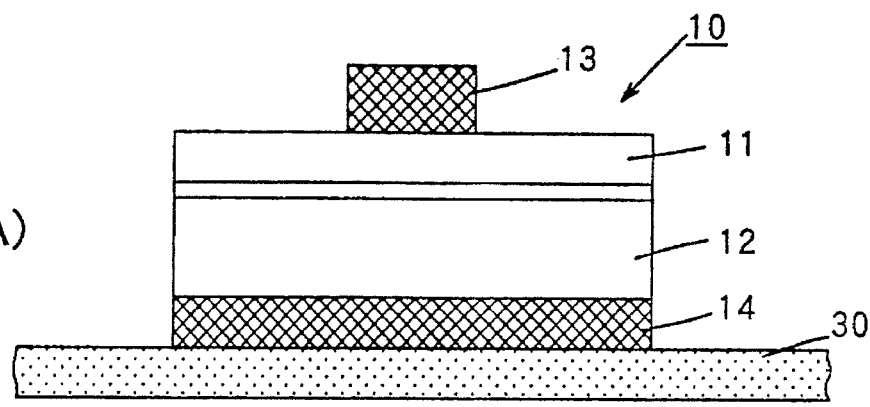
FIG. 1 is a process diagram showing the method of one example of this invention.
Figure 1:
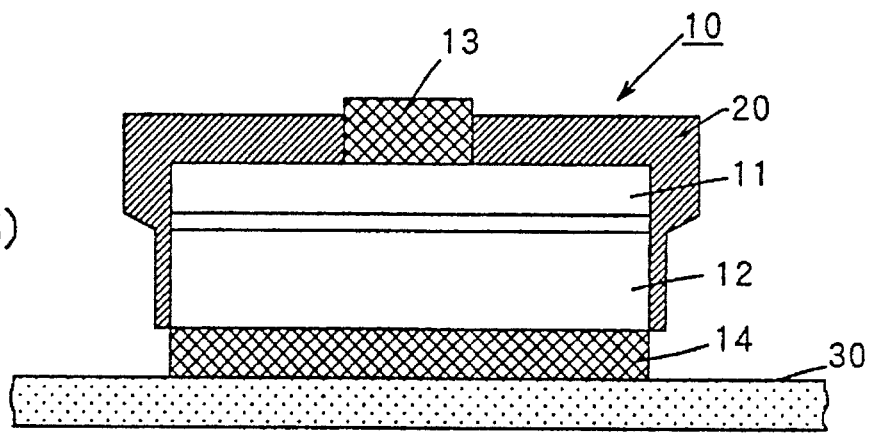
Figure 1:
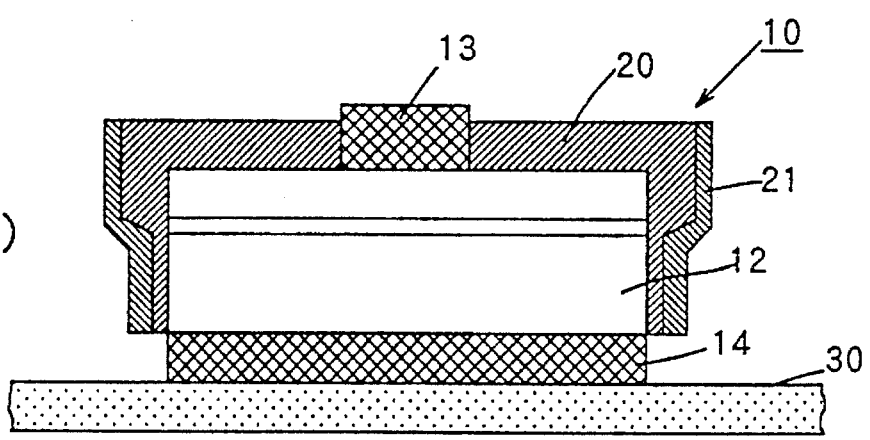
Figure 1:
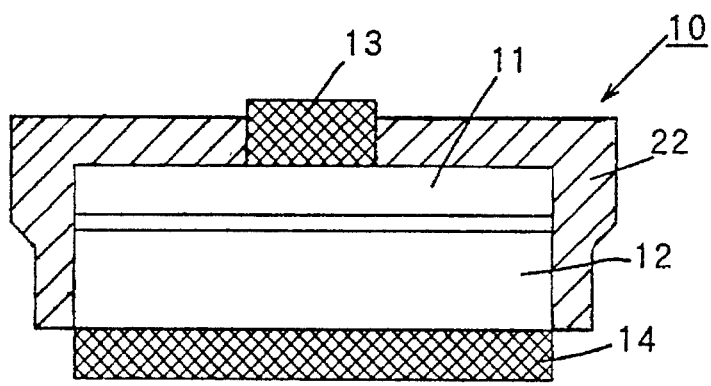
Figure 4:
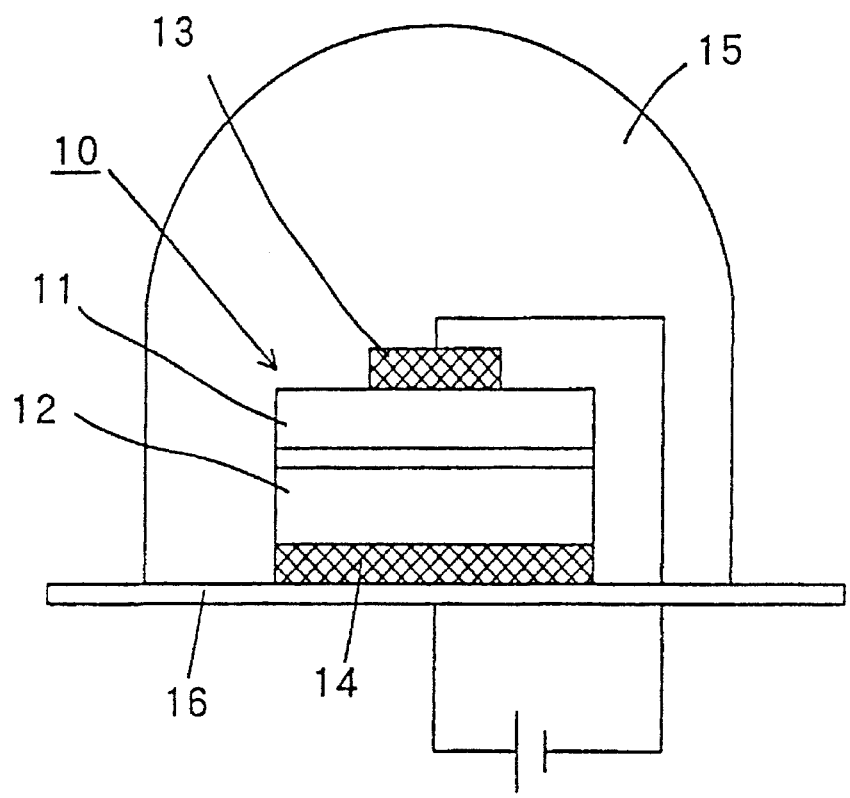
FIG. 4 is a configuration diagram showing the structure of a light emitting device.
Figure 5:
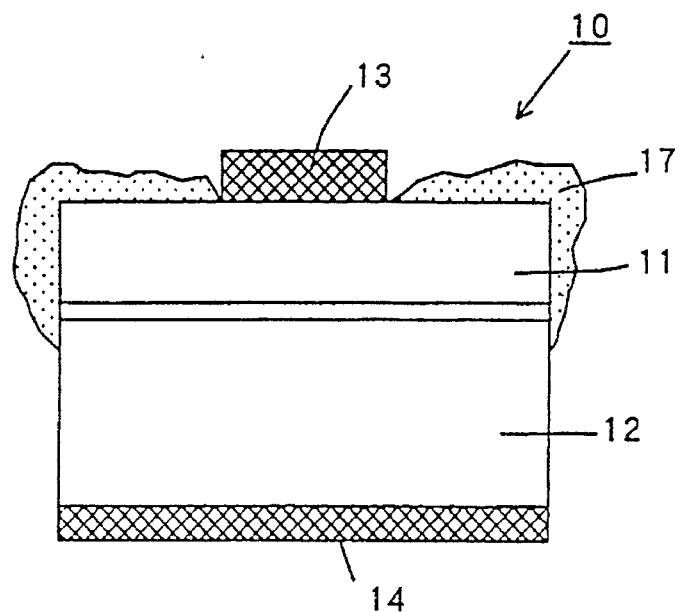
FIG. 5 shows a cross section of an AlGaAs chip on which a clouded layer is generated.
Figure 6:
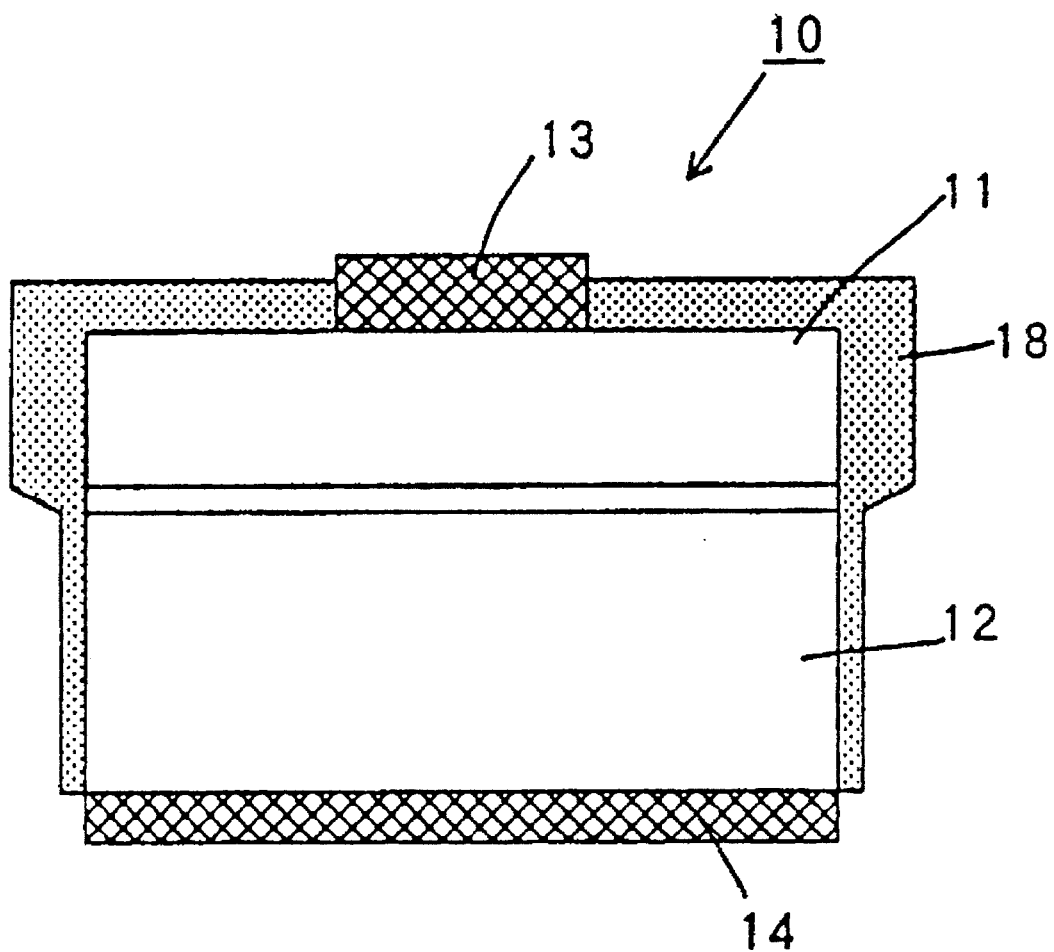
FIG. 6 shows a cross section of an AlGaAs chip on which a nonuniform protective layer with large thickness difference is formed.

FIG. 1 is a process diagram showing the method of Example 1. In FIG. 1, parts that are identical to or the equivalent of their counterparts in FIGS. 4 through 6 are given the same symbols and a description of them is omitted. In the method of Example 1, (1) the primary process, (2) the drying process, and (3) the secondary process, shown below, are performed in this order.

(1) The primary process

The surface on the side of the p-type layer 12 (chip lower surface, i.e. the surface to be fixed to the base) of an AlGaAs chip 10 is adhered to an adhesive sheet 30 (FIG. 1(A)), and immersed in an ammonia-hydrogen peroxide aqueous solution containing 0.3 wt. % of ammonia and 30 wt. % of hydrogen peroxide for 10 minutes to form the primary protective layer 20 (FIG. 1(B)).

(2) The drying process

After completion of the primary process, the AlGaAs chip 10 is taken out of the aqueous solution, and rinsed with water for 3 minutes. The adhering moisture is then blown away by blowing air. The AlGaAs chip 10, with the adhesive sheet 30, is then let stand for 2 hours at room temperature for natural drying. Heated drying is also acceptable for a shorter drying time.

(3) The secondary process

After completion of the drying, with the surface on the side of the p-type layer 12 of the AlGaAs chip 10 still adhered to the adhesive sheet 30, the chip 10 is immersed in an ammonia-hydrogen peroxide aqueous solution containing 0.5 wt. % of ammonia and 30 wt. % of hydrogen peroxide for 10 minutes to form the secondary protective layer 21 (FIG. 1(C)).

By the treatment described above, a fine (high density) and uniform protective layer 22 with a sufficient thickness, 150 nm on the side of the p-type layer 12 and 300 nm on the side of the n-type layer 11, was formed on the upper surface and the side surfaces of the AlGaAs chip 10 (FIG. 1(D)).

Example 2

Figure 2:
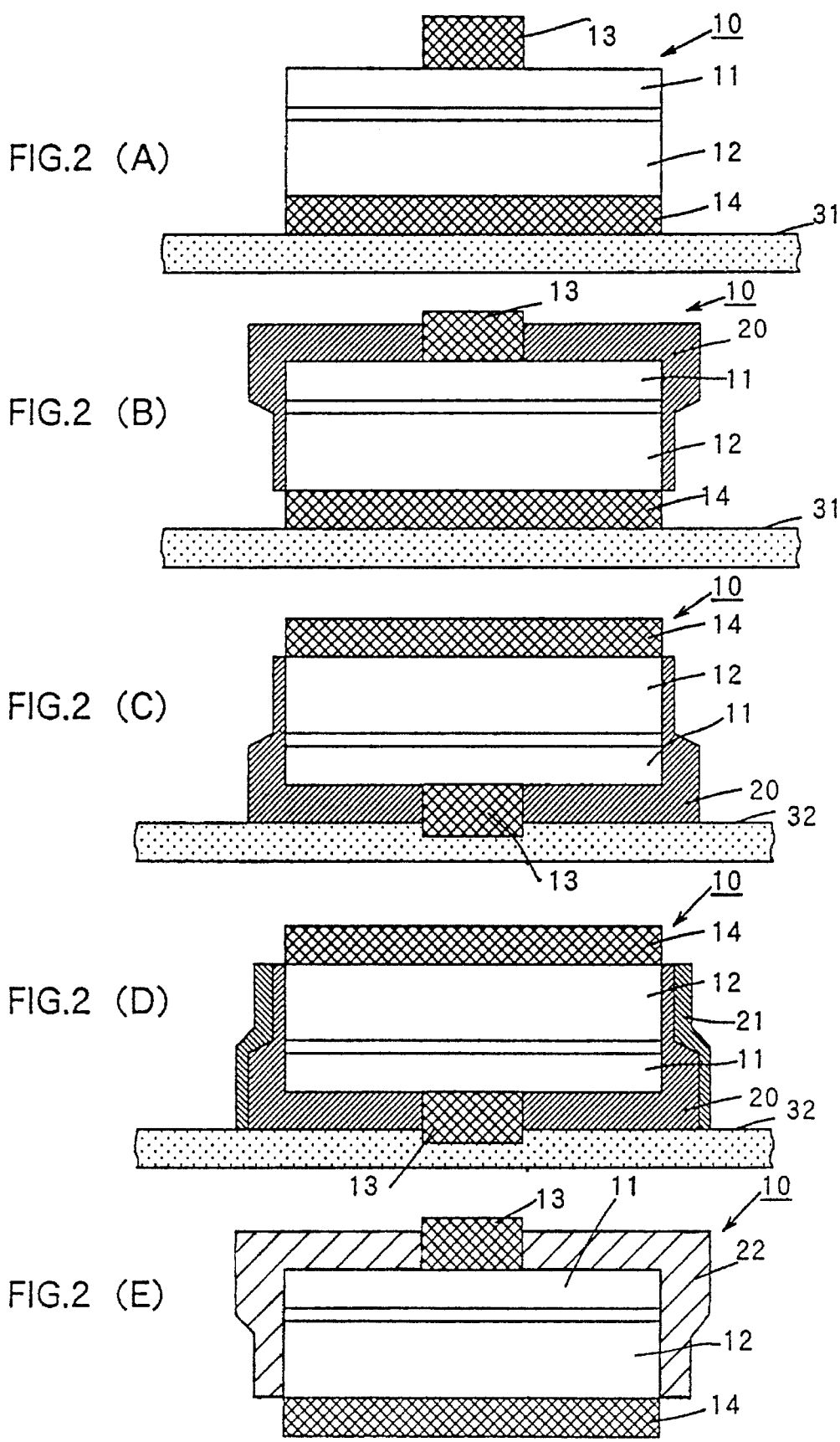
FIG. 2 is a process diagram showing the method of another example of this invention.

FIG. 2 is a process diagram showing the method of Example 2. In FIG. 2, parts that are identical to or the equivalent of their counterparts in FIGS. 4 through 6 are given the same symbols and a description of them is omitted. In the method of Example 2, just as in Example 1, (1) the primary process, (2) the drying process, and (3) the secondary process, shown below, are performed in this order. Characteristic of this example is that it includes the so-called "sheet transfer" of the chip 10.

(1) The primary process

The surface on the side of the p-type layer 12 (the chip lower surface, i.e. the surface to be fixed to the base) of an AlGaAs chip 10 is adhered to an adhesive sheet 31 (FIG. 2(A)), and immersed in an ammonia-hydrogen peroxide aqueous solution containing 0.3 wt. % of ammonia and 30 wt. % of hydrogen peroxide for 10 minutes to form the primary protective layer 20 (FIG. 2(B)).

(2) The drying process

After completion of the primary process, the AlGaAs chip 10 is taken out from said aqueous solution, and rinsed with water for 3 minutes. The adhering moisture is then blown away by blowing air. The AlGaAs chip 10, with the adhesive sheet 31, is then let stand for 2 hours at room temperature for natural drying. Heated drying is also acceptable for a shorter drying time. After completion of the drying, the surface on the side of the n-type layer 11 of the AlGaAs chip 10 (chip upper surface or light extracting surface) is adhered to an adhesive sheet 32 (FIG. 2(C)).

(3) The secondary process

With the surface on the side of the n-type layer 11 of the AlGaAs chip 10 still adhered to the adhesive sheet 32, the chip is immersed in an ammonia-hydrogen peroxide aqueous solution containing 0.5 wt. % of ammonia and 30 wt. % of hydrogen peroxide for 10 minutes to form the secondary protective layer 21 (FIG. 2(D)).

By the treatment described above, a fine (high density) and uniform protective layer 22 with a sufficient thickness, 200 nm on the side of the p-type layer 12 and 300 nm on the side of the n-type layer 11, was formed on the upper surface and the side surfaces of the AlGaAs chip 10 (FIG. 2(E)).

Figure 3:
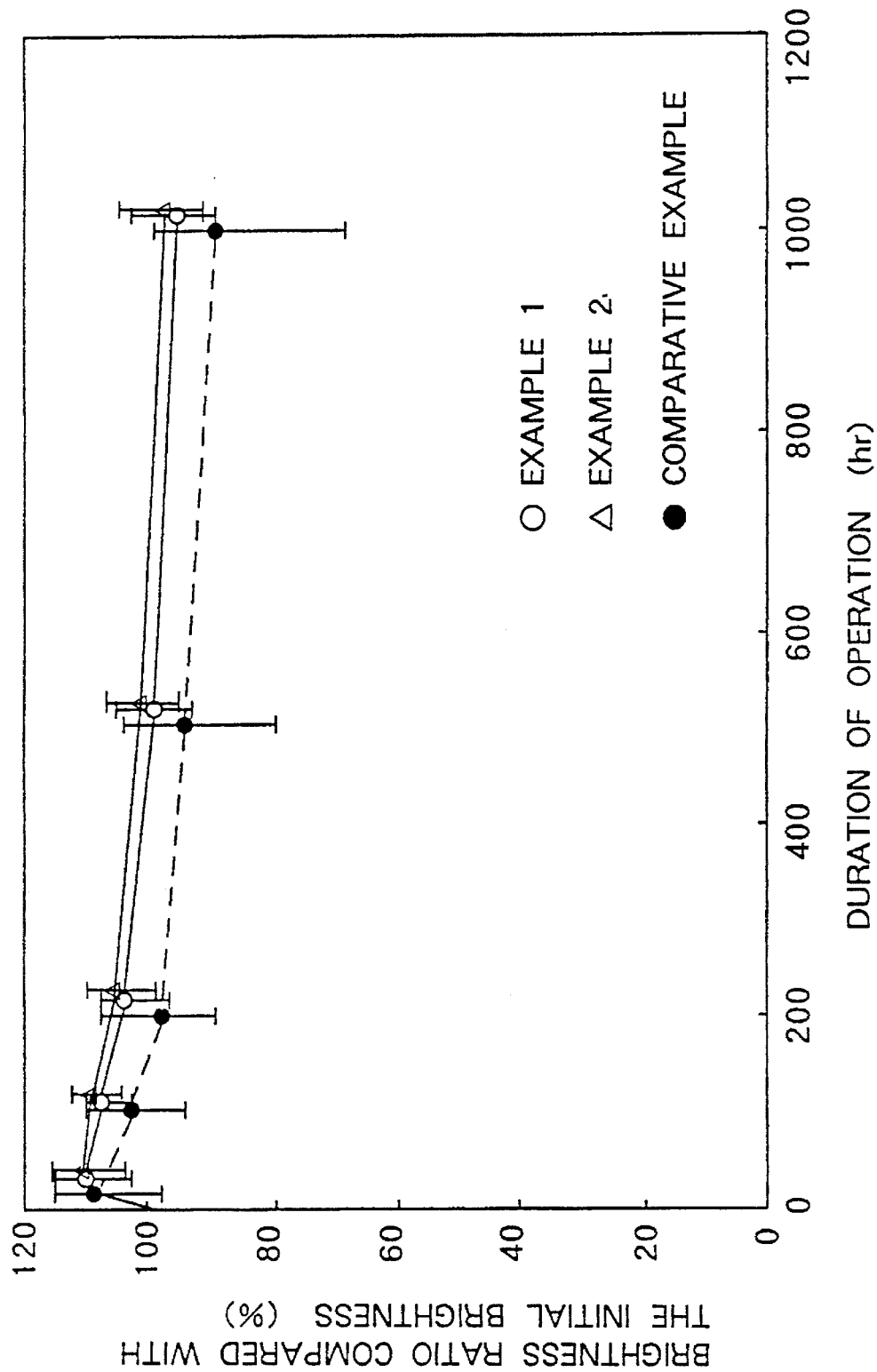
FIG. 3 is a graph showing results of the high-temperature/ high-humidity reliability testing on light emitting devices prepared with the methods of the examples and light emitting devices prepared with a conventional method.

FIG. 3 is a graph showing the time dependent change in the brightness ratio compared with the initial brightness when high temperature and high humidity testing was carried out for the light emitting devices prepared in the methods of Example 1 and Example 2, as well as a light emitting device prepared with a conventional method. The test consisted of continuous operation with a temperature of 85° C., a relative humidity of 100% and $I_F$=30 mA. It can be confirmed from FIG. 3 that the light emitting device of Example 1 shows a smaller reduction in the brightness ratio compared with the light emitting device of the conventional method, indicating higher reliability. The light emitting device of Example 2 showed an even smaller reduction, although not by much, in the brightness ratio compared with the light emitting device of Example 1, indicating a better result.

As described thus far, this invention allows formation of a fine (high density) and uniform protective layer on the side surfaces of an AlGaAs chip, and therefore a light emitting device equipped with this chip does not sustain a reduction in brightness even under highly humid conditions and is highly reliable over an extended period of time.

We claim:

1. A method of manufacturing a light emitting device characterized by the fact that an AlGaAs chip which has an n-type layer(s) and a p-type layer(s) is treated with the following processes to form a protective layer primarily composed of aluminum oxide on the top surface and the side surfaces of said AlGaAs chip, comprising:

(a) a process in which said AlGaAs chip which has said n-type layer(s) and said p-type layer(s) is immersed in an ammonia-hydrogen peroxide aqueous solution containing 0.2–0.6 wt. % of ammonia and 25–35 wt. % of hydrogen peroxide, (b) a process in which, after said process (a), said AlGaAs chip is dried, and (c) a process in which, after said process (b), said AlGaAs chip is immersed for a second time in an ammonia-hydrogen peroxide aqueous solution containing 0.2–0.6 wt. % of ammonia and 25–35 wt. % of hydrogen peroxide.

2. A method of manufacturing a light emitting device as described in claim 1 wherein:

a lower surface of said AlGaAs chip which is to be fixed to a base is adhered to an adhesive sheet, and said processes (a) and (b) are carried out with this configuration; and the surface of said AlGaAs chip which is adhered to an adhesive sheet is altered from the lower surface to the upper surface on the light extracting side of said AlGaAs chip, and said process (c) is carried out with said upper surface of said AlGaAs chip adhered to an adhesive sheet.

3. A method of manufacturing a light emitting device as described in claim 1 characterized by the fact that a protective layer primarily composed of aluminum oxide is formed with a thickness of 100 nm or more.

* * * * *